United States Patent
Tsai

(10) Patent No.: US 11,832,440 B2
(45) Date of Patent: Nov. 28, 2023

(54) METHOD OF FORMING MEMORY DEVICE

(71) Applicant: NANYA TECHNOLOGY CORPORATION, New Taipei (TW)

(72) Inventor: Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/811,065

(22) Filed: Jul. 6, 2022

(65) Prior Publication Data

US 2022/0344335 A1 Oct. 27, 2022

Related U.S. Application Data

(62) Division of application No. 17/002,765, filed on Aug. 25, 2020, now Pat. No. 11,417,662.

(51) Int. Cl.
*H10B 12/00* (2023.01)
*H01L 23/528* (2006.01)

(52) U.S. Cl.
CPC ......... *H10B 12/33* (2023.02); *H01L 23/5283* (2013.01); *H10B 12/05* (2023.02); *H10B 12/482* (2023.02); *H10B 12/485* (2023.02); *H10B 12/50* (2023.02)

(58) Field of Classification Search
CPC ............. H01L 27/1082; H01L 23/5283; H01L 27/10873; H01L 27/10885; H01L 27/10888; H01L 27/10897; H10B 12/373; H10B 12/33; H10B 12/01; H10B 12/05; H10B 12/03

See application file for complete search history.

(56) References Cited

U.S. PATENT DOCUMENTS

| | | | |
|---|---|---|---|
| 9,698,272 B1 | 7/2017 | Ikeda et al. | |
| 2018/0012538 A1* | 1/2018 | Asami | G09G 3/3225 |
| 2018/0061840 A1* | 3/2018 | Sills | H10B 12/01 |
| 2021/0104525 A1* | 4/2021 | Tsai | H01L 29/7869 |
| 2021/0242208 A1* | 8/2021 | Manfrini | H10B 12/488 |
| 2021/0265358 A1* | 8/2021 | Tsai | H10B 12/33 |
| 2021/0313329 A1* | 10/2021 | Han | H10B 12/315 |
| 2022/0068924 A1* | 3/2022 | Tsai | H10B 12/33 |

OTHER PUBLICATIONS

Ivan Ciofi et al., "Modeling of via Resistance for Advanced Technology Nodes," IEEE Transactions on Electron Devices, vol. 64, No. 5, May 2017.

* cited by examiner

*Primary Examiner* — Edward Chin
(74) *Attorney, Agent, or Firm* — CKC & Partners Co., LLC

(57) ABSTRACT

A method includes forming a first conductive line and a second conductive respectively above a memory region and a peripheral region of a substrate. A capacitor is formed above the first conductive line. A bottom portion of a contact structure is formed above the second conductive line. A first dielectric layer is formed covering the capacitor and the bottom portion. First and second openings are formed in the first dielectric layer. The first opening is above the capacitor, and the second opening exposes the bottom portion. A middle portion of the contact structure and a gate material are respectively formed in the second opening and the first opening. A third opening is formed in the gate material to form a gate structure. A gate dielectric layer and a channel are formed in the third opening. A bit line is connected to the channel and the contact structure.

7 Claims, 13 Drawing Sheets

METHOD OF FORMING MEMORY DEVICE

CROSS-REFERENCE TO RELATED APPLICATION

This application is a Divisional application of the U.S. application Ser. No. 17/002,765, filed on Aug. 25, 2020, the entirety of which is incorporated by reference herein in their entireties.

BACKGROUND

Technical Field

The present disclosure relates to a method of forming a memory device.

Description of Related Art

Semiconductor memory devices may be classified into two categories, volatile memory devices and nonvolatile memory devices. The volatile memory cells, such as dynamic random access memory (DRAM) cells, may include a transistor and a capacitor. The capacitor can either be charged or discharged; these two states are taken to represent the two values of a bit, called 0 and 1. The transistor may include a channel between a pair of source/drain regions and a gate configured to electrically connect the source/drain regions to one another through the channel.

SUMMARY

One aspect of the present disclosure is a method of forming a memory device.

According to some embodiments of the present disclosure, a method of forming a memory device includes following steps. A first conductive line is formed above a memory region of a substrate and a second conductive line is formed above a peripheral region of the substrate. A capacitor is formed above the first conductive line. A bottom portion of a contact structure is formed above the second conductive line. A first dielectric layer is formed covering the capacitor and the bottom portion of the contact structure. A first opening and a second opening are formed in the first dielectric layer, in which the first opening is above the capacitor, and the second opening exposes the bottom portion of the contact structure. A conductive material is filled in the first opening and the second opening such that a middle portion of the contact structure is formed in the second opening and a gate material is formed in the first opening. A third opening is formed in the gate material to form a gate structure in the first opening. A gate dielectric layer and a channel are formed in the third opening. A bit line is formed to be connected to the channel and the contact structure.

In some embodiments, forming the first opening and the second opening are performed by using one etching process.

In some embodiments, the method of forming the memory device further includes forming a second dielectric layer above the gate structure prior to forming the bit line.

In some embodiments, the method of forming the memory device further includes forming a top portion of the contact structure in the second dielectric layer.

In some embodiments, the method of forming the memory device further includes forming a source/drain region in the second dielectric layer, and the bit line is formed to be connected to the source/drain region.

In some embodiments, the middle portion of the contact structure and the gate structure includes the same material.

In some embodiments, the channel is an oxide layer.

In the aforementioned embodiments, since the contact structure includes the bottom portion, the top portion and the middle portion, and the middle portion is at a height substantially level with the gate structure of the transistor, the contact area can be increased and the resistance can be reduced. As a result, the performance of the memory device can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
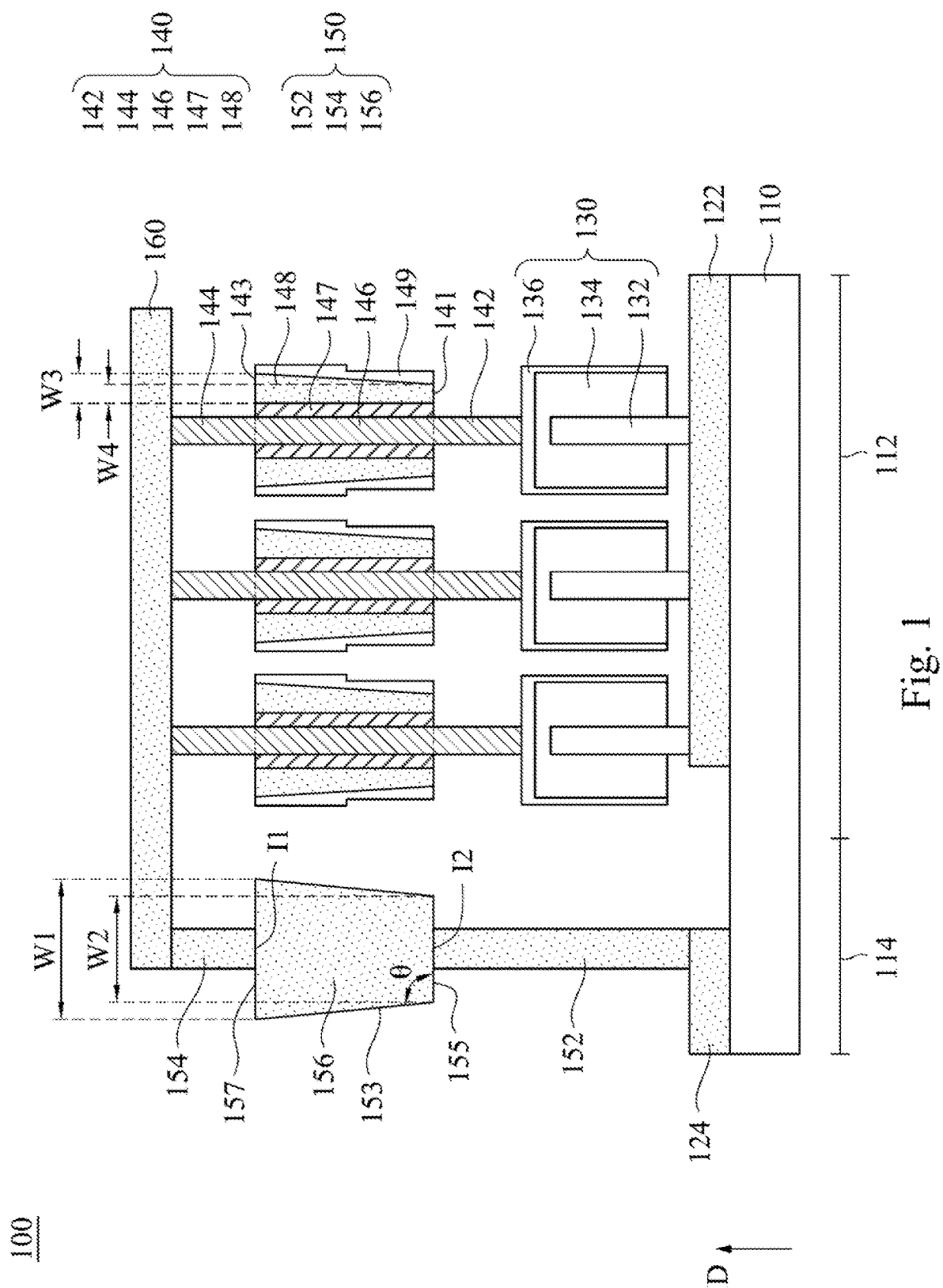
FIG. 1 is a cross-sectional view of a memory device in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Figure 2:
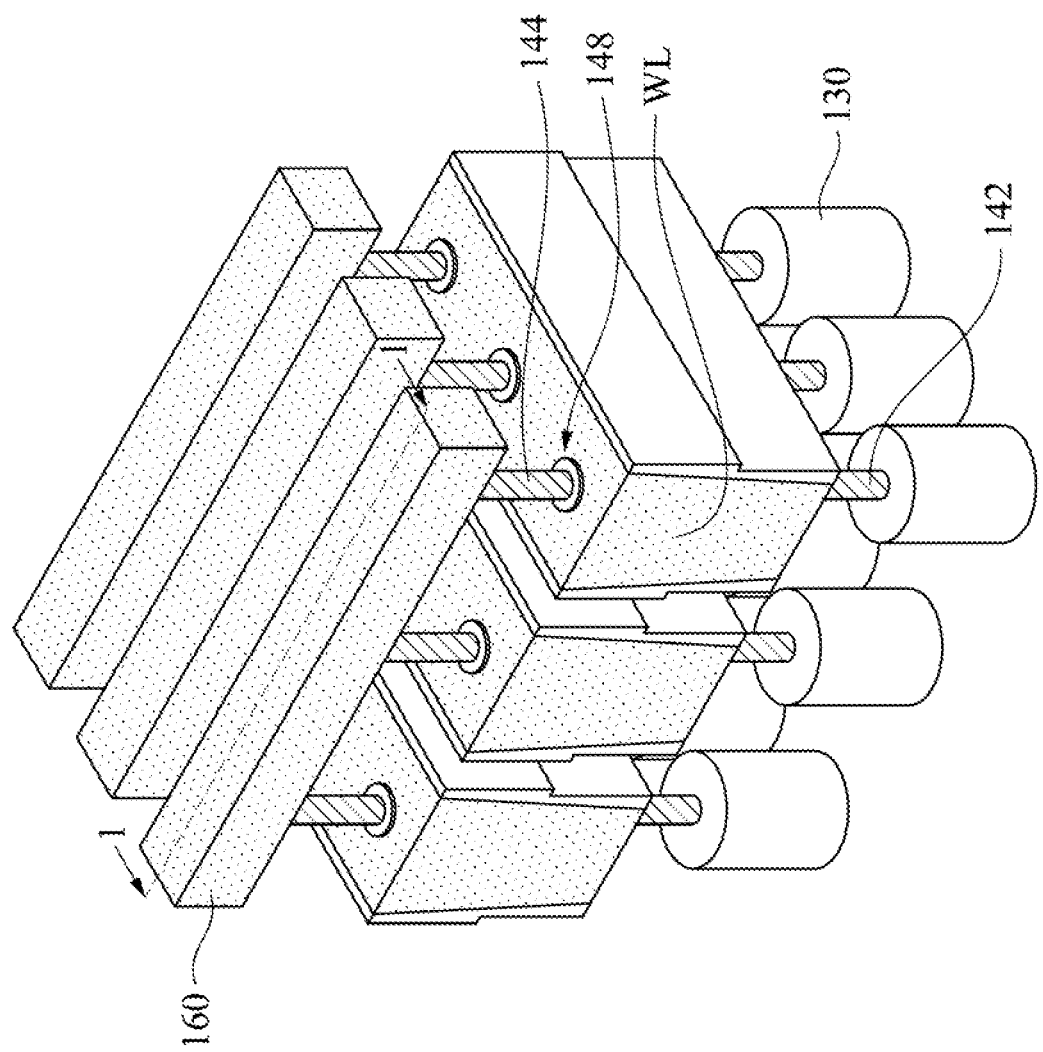
FIG. 2 is a schematic perspective view of the memory device above a memory region in FIG. 1.

FIG. 1 is a cross-sectional view of a memory device 100 in accordance with some embodiments of the present disclosure, and FIG. 2 is a schematic perspective view of the memory device 100 above a memory region 112 in FIG. 1. Referring to FIG. 1 and FIG. 2, the memory device 100 includes a substrate 110, a conductive line 124, a capacitor 130, a transistor 140, and a contact structure 150.

The substrate 110 has a memory region 112 and a peripheral region 114.

The conductive line 124 is disposed above the peripheral region 114. In greater details, the memory device 100 further includes another conductive line 122 above the memory region 112. In some embodiments, the conductive line 124 is connected to a sensor, an amplify, a peripheral circuit, or other electrical devices.

The capacitor 130 is disposed above the memory region 112 of the substrate 110. The capacitor 130 includes a bottom electrode 132, a dielectric layer 134, and a top electrode 136. The bottom electrode 132 is in contact with the conductive line 122. The dielectric layer 134 surrounds the bottom electrode 132, and the top electrode 136 covers the dielectric layer 134 and spaced apart from the bottom electrode 132. In some embodiments, the bottom electrode 132 may be in a column-shaped and extends upward from the conductive line 122.

The transistor 140 is disposed above and connected to the capacitor 130. The transistor 140 includes a first source/drain region 142 and a second source/drain region 144, a channel 146, and a gate structure 148. The first source/drain region 142 is connected to the capacitor 130. In greater details, the first source/drain region 142 is connected to the top electrode 136 of the capacitor 130. The channel 146 is disposed between the first source/drain region 142 and the second source/drain region 144. In some embodiments, the first source/drain region 142, the second source/drain region 144, and the channel 146 may serve as an active area of the transistor 140. The gate structure 148 laterally surrounds the channel 146. In some embodiments, the transistor 140 further includes a gate dielectric layer 147 between the channel 146 and the gate structure 148 and laterally surrounds the channel 146. In other words, the gate dielectric layer 147 is disposed on a sidewall of the channel 146, and the gate structure 148 is disposed on a sidewall of the gate dielectric layer 147. In some embodiments, a dielectric structure 149 laterally surrounds the gate structure 148.

As shown in FIG. 2, a word line WL is between the first source/drain region 142 and the second source/drain region 144. A portion of the word line WL surrounding the active area (the first source/drain region 142, the second source/drain region 144, and the channel 146 in FIG. 1) may serve as the gate structure 148.

The contact structure 150 is disposed above the peripheral region 114 of the substrate 110, and the contact structure 150 includes a bottom portion 152, a top portion 154, and a middle portion 156. The bottom portion 152 is connected to the conductive line 124. The top portion 154 is connected to the second source/drain region 144 of the transistor 140. The middle portion 156 is wider than the top portion 154 and the bottom portion 152, in which the middle portion 156 of the contact structure 150 is at a height substantially level with the gate structure 148 of the transistor 140. Since the middle portion 156 is wider than the top portion 154 and the bottom portion 152, the contact area can be increased and can be beneficial for the connection between the top portion 154 and the bottom portion 152, thereby reducing the resistance of the contact structure 150. As a result, the performance of the memory device 100 can be improved.

In some embodiments, the middle portion 156 of the contact structure 150 has a sidewall 153, a bottom surface 155 in contact with the bottom portion 152 of the contact structure 150, and a top surface 157 in contact with the top portion 154 of the contact structure. The top surface 157 has a width substantially larger than that of the bottom surface 155. In some embodiments, an angle θ between the sidewall 153 and the bottom surface 155 is larger than about 90 degrees and smaller than about 180 degrees. For example, the angle θ between the sidewall 153 and the bottom surface 155 ranges from about 135 degrees to about 180 degrees.

In some embodiments, an interface 11 is formed between the top portion 154 of the contact structure 150 and the middle portion 156 of the contact structure 150. The interface 11 and the top surface 157 of the middle portion 156 are substantially coplanar. In some embodiments, an interface 12 is formed between the bottom portion 152 of the contact structure 150 and the middle portion 156 of the contact structure 150. The interface 12 and the bottom surface 155 of the middle portion 156 are substantially coplanar.

In some embodiments, the bottom surface 155 of the middle portion 156 of the contact structure 150 and a bottom surface 141 of the gate structure 148 of the transistor 140 are substantially coplanar. In some embodiments, the top surface 157 of the middle portion 156 of the contact structure 150 and a top surface 143 of the gate structure 148 of the transistor 140 are substantially coplanar. That is, the middle portion 156 and the gate structure 148 have substantially the same height.

In some embodiments, a width of the middle portion 156 of the contact structure 150 is greater than a width of the gate structure 148 of the transistor 140. For example, the middle portion 156 of the contact structure 150 has a maximum width W1 and a minimum width W2, and the gate structure 148 of the transistor 140 has a maximum width W3 and a minimum width W4. The maximum width W1 of the middle portion 156 is greater than the maximum width W3 of the gate structure 148. The minimum width W2 of the middle portion 156 is greater than the minimum width W4 of the gate structure 148. With such configuration, the middle portion 156 improves the conductivity resistance of the contact structure 150.

Figure 13:
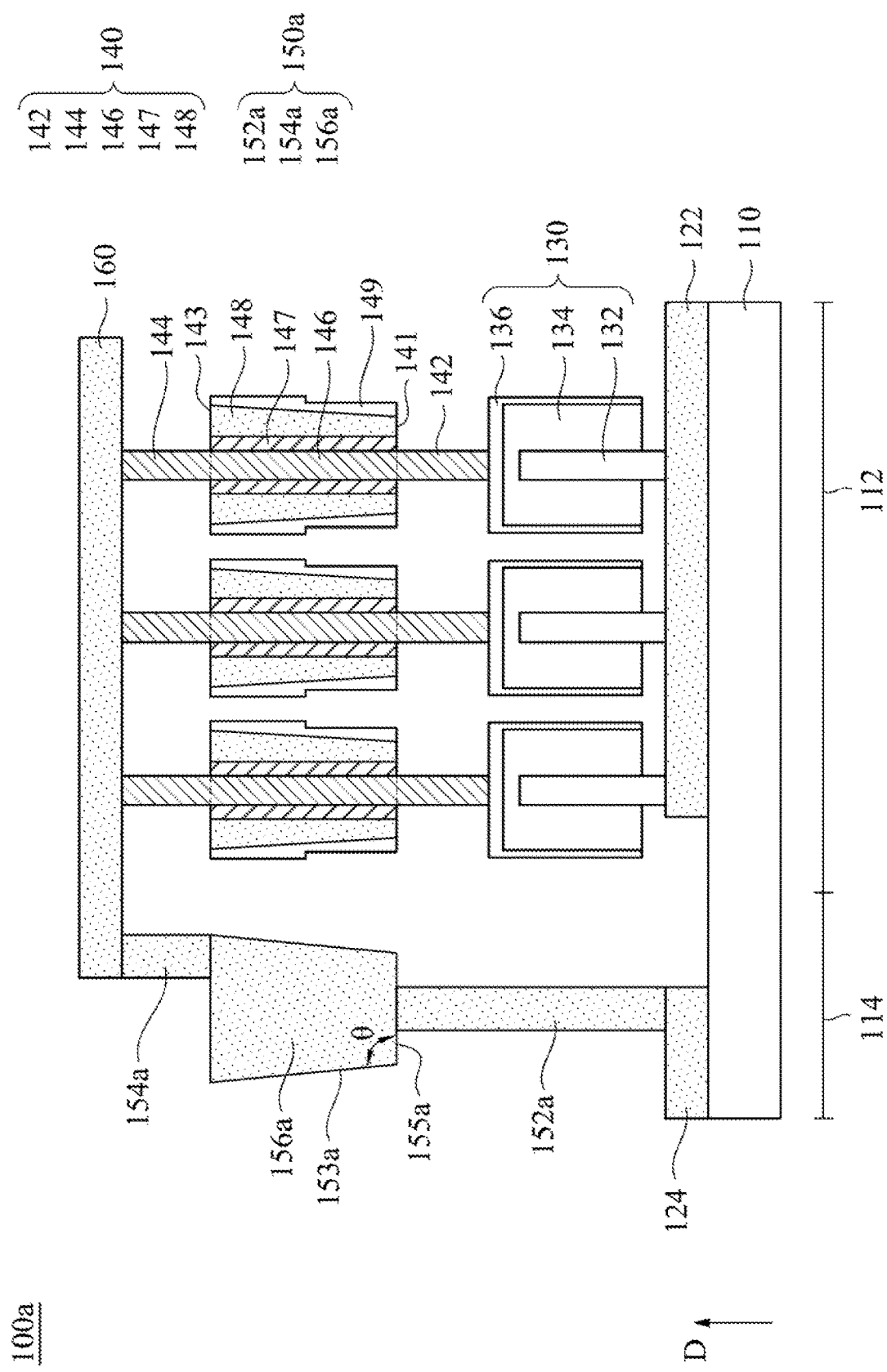
FIG. 13 is a cross-sectional view of a memory device in accordance with another embodiment of the present disclosure.

In some embodiments, the top portion 154 of the contact structure 150 and the bottom portion 152 of the contact structure 150 are substantially aligned with each other in a vertical direction D. In some embodiments, the vertical direction D is an extension direction of the bottom portion 152 (or the top portion 154). In some embodiments, the vertical direction D is substantially perpendicular to an extension direction of the conductive lines 122 and 124. In some other embodiments, the top portion 154 of the contact structure 150 and the bottom portion 152 of the contact structure 150 are misaligned with each other in the vertical direction D as shown in FIG. 13.

In some embodiments, the memory device 100 further includes a bit line 160. The bit line 160 is disposed above and in contact with the top portion 154 of the contact structure 150 and the second source/drain region 144 of the transistor 140. That is, the contact structure 150 is electrically connected to the transistors 140 through the bit line 160. In some embodiments, an extension direction of the bit line 160 is substantially perpendicular to an extension direction of the word line WL (i.e., the gate structure 148) of the transistor 140 as shown in FIG. 2. Further, the extension direction of the bit line 160 is also substantially perpendicular to the vertical direction D.

FIGS. 3-12 are cross-sectional views of a method of forming the memory device 100 of FIG. 1 at various stages in accordance with some embodiments of the present disclosure.

Figure 3:
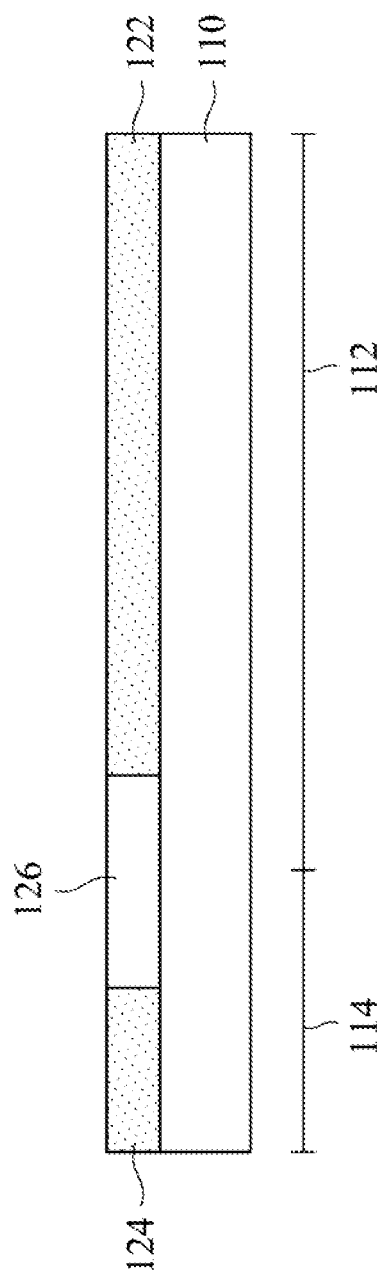
FIGS. 3-12 are cross-sectional views of a method of forming the memory device at various stages in accordance with some embodiments of the present disclosure.

Referring to FIG. 3, the substrate 110 including the memory region 112 and the peripheral region 114 are provided. In some embodiments, the substrate 110 includes an elementary semiconductor, such as germanium, or silicon; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The conductive line 122 is formed above the memory region 112 of the substrate 110, and the conductive line 124 is disposed above the peripheral region 114 of the substrate 110. The conductive line 122 is at a height substantially level with the conductive line 124. In other words, the conductive line 122 and the conductive line 124 are substantially coplanar. The conductive line 122 and the conductive line 124 may be formed in the same process and thus may include the same material. For example, a blanket conductive layer is formed above the substrate 110, and a patterning process, such as an etching process, is performed to form the conductive lines 122 and 124 on the substrate 110. The conductive lines 122 and 124 may be made of metals, such as tungsten (W), or other suitable conductive materials.

In some embodiments, an isolation structure 126 is formed between the conductive line 122 124. The isolation structure 126 may be made of silicon oxide ($SiO_2$), silicon nitride (SiN), silicon oxynitride (SiON), or other suitable materials.

Figure 4:
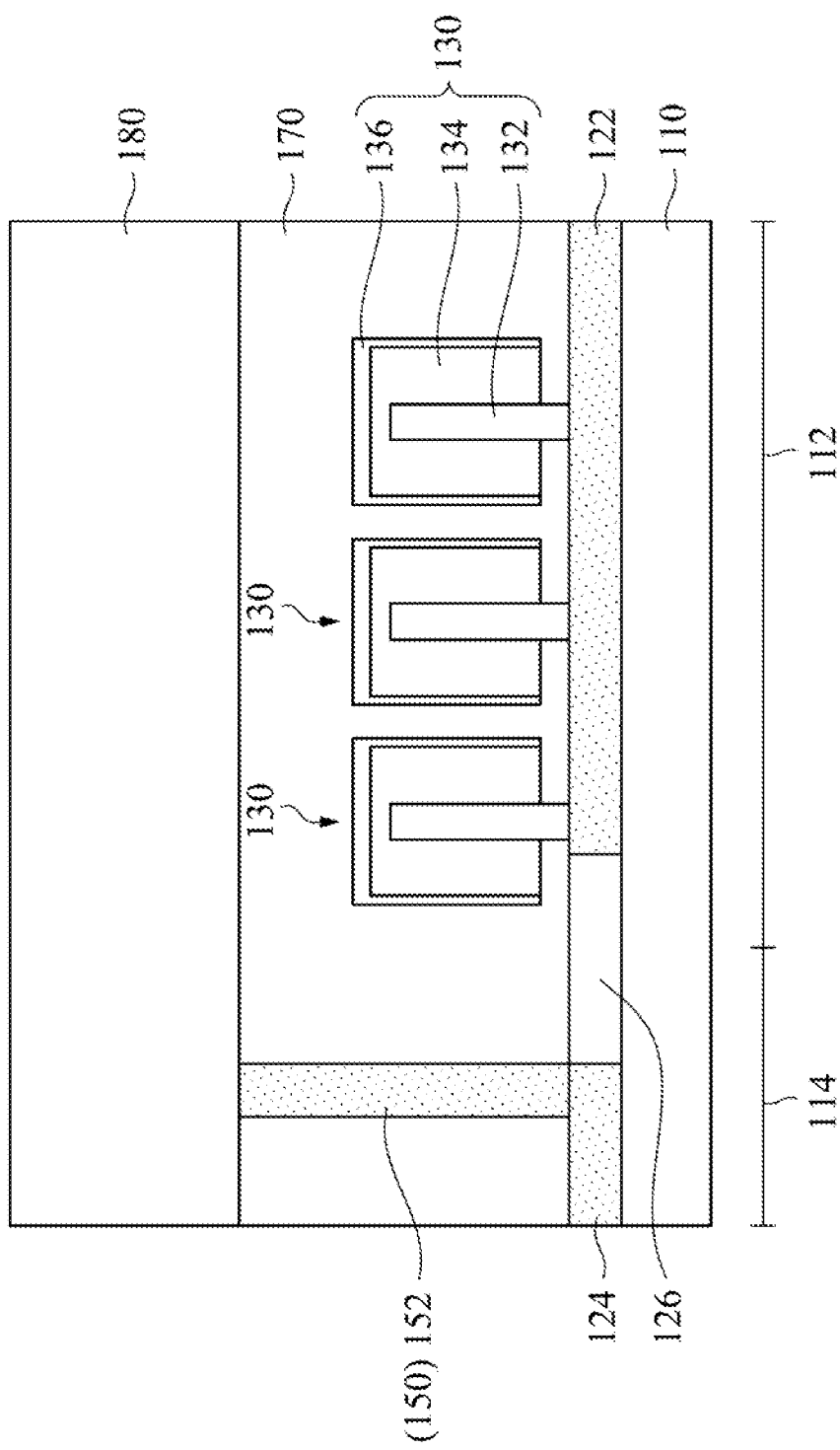

Referring to FIG. 4, after the conductive line 122 and 124 are formed, a dielectric layer 170 is formed above the conductive line 122 and 124. Thereafter, the capacitors 130 are formed above the first conductive line 122. In greater details, each of the capacitors 130 includes the bottom electrode 132, the dielectric layer 134 surrounding the bottom electrode 132, and the top electrode 136 covering the dielectric layer 134. The bottom electrode 132 and the top electrode 136 may be made of polysilicon, or other suitable conductive materials. The dielectric layer 134 may be made of high-k dielectric materials. For example, the high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, or combinations thereof. In some embodiments, the dielectric layer 170 may be formed by chemical vapor deposition (CVD), atomic layer deposition (ALD), or other suitable methods. The dielectric layer 170 may be made of silicon oxide ($SiO_2$), silicon nitride (SiN), silicon oxynitride (SiON), or other suitable materials.

After the capacitor 130 is formed above the first conductive line 122, the bottom portion 152 of the contact structure 150 is formed above the second conductive line 124. For example, an opening is formed in the dielectric layer 170 to expose the conductive line 124, and conductive material fills the opening.

In some embodiments, excess portions of the conductive material are removed by performing a planarization process (e.g., a CMP process) such that a portion of the conductive material in the opening forms the bottom portion 152 of the contact structure 150. In some embodiments, the bottom portion 152 of the contact structure is made of tungsten, aluminum, copper, or other conductive materials. In some embodiments, the bottom portion 152 of the contact structure 150 is formed prior to forming the capacitors 130 above the first conductive line 122.

Thereafter, a dielectric layer 180 is formed covering the capacitor 130 and the bottom portion 152 of the contact structure 150. In other words, the dielectric layer 180 is formed above the dielectric layer 170. In some embodiments, the dielectric layer 180 is formed by chemical vapor deposition (CVD), atomic layer deposition (ALD), or other suitable methods. The dielectric layer 180 may be made of silicon oxide ($SiO_2$), silicon nitride (SiN), silicon oxynitride (SiON), or other suitable materials. In some embodiments, the dielectric layer 170 and the dielectric layer 180 are made of different materials.

Figure 5:
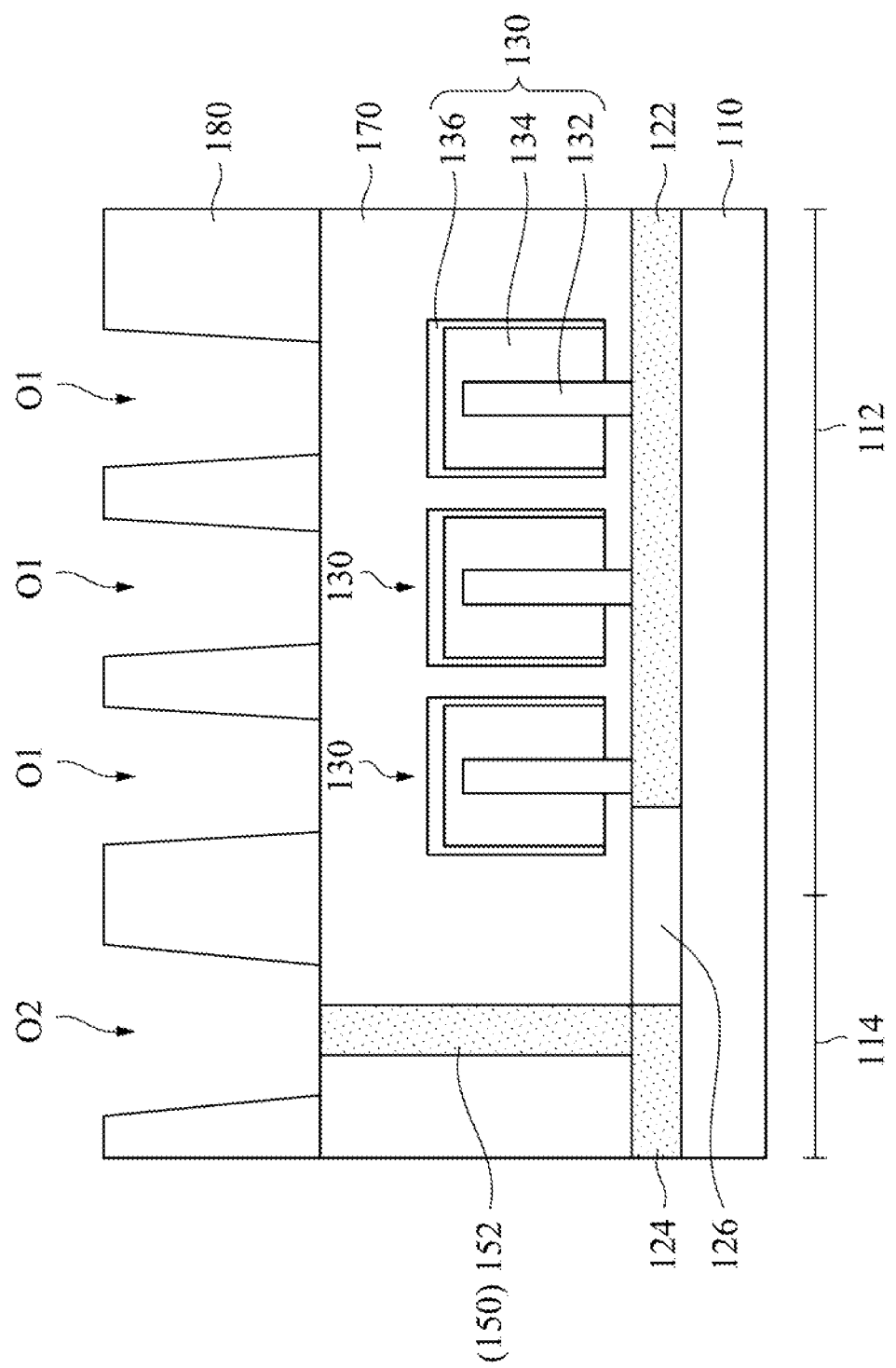

Referring to FIG. 5, after the dielectric layer 180 is formed, first openings O1 and at least one second opening O2 are formed in the dielectric layer 180, in which the first openings O1 are respectively above the capacitors 130, and the second opening O2 exposes the bottom portion 152 of the contact structure 150. In some embodiments, each of the first openings O1 is narrower than the second opening O2. In some embodiments, forming the first openings O1 and the second opening O2 are performed by using one etching process. The dielectric layer 180 may be etched to form the first openings O1 and the second opening O2 by using either dry or wet etching method. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like.

Figure 6:
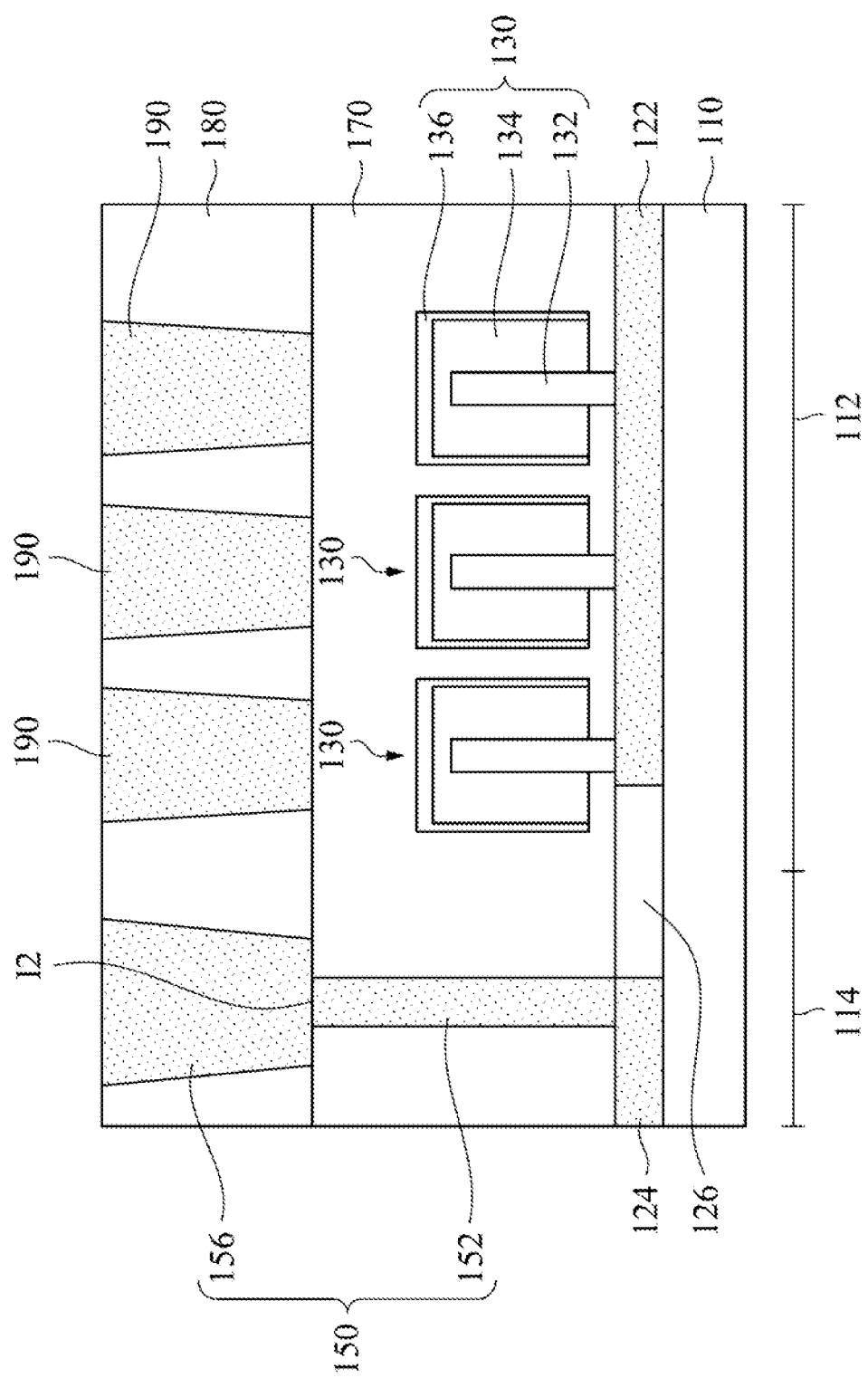

Referring to FIG. 5 and FIG. 6, a conductive material is filled in the first openings O1 and the second opening O2, such that the middle portion 156 of the contact structure 150 is formed in the second opening O2 and gate materials 190 are respectively formed in the first openings O1. Since the middle portion 156 of the contact structure 150 and the bottom portion 152 of the contact structure 150 are formed by using different deposition processes, the interface 12 is formed between middle portion 156 and the bottom portion 152. In some embodiments, the conductive material (the middle portion 156 and the gate material 190) includes a multi-layer structure, such as a work function metal layer and a filling metal layer. For example, the work function metal layer is filled in the first openings O1 and the second opening O2, and then the filling metal layer is formed above the work function metal layer. In some embodiments, the conductive material (the middle portion 156 and the gate material 190) is made of metal, such as tungsten or other suitable materials. In some embodiments, the middle portion 156 of the contact structure 150 and the bottom portion 152 of the contact structure include the same material.

In some embodiments, after the conductive material is filled in the first openings O1 and the second opening O2, a planarization process (e.g., a CMP process) is performed to remove excess portions of the conductive material outside the first openings O1 and the second opening O2 such that the top surface of the middle portion 156 of the contact structure 150 and the top surfaces of the gate materials 190 (and the following formed gate structures 148, see FIG. 8) are substantially coplanar.

Figure 7:
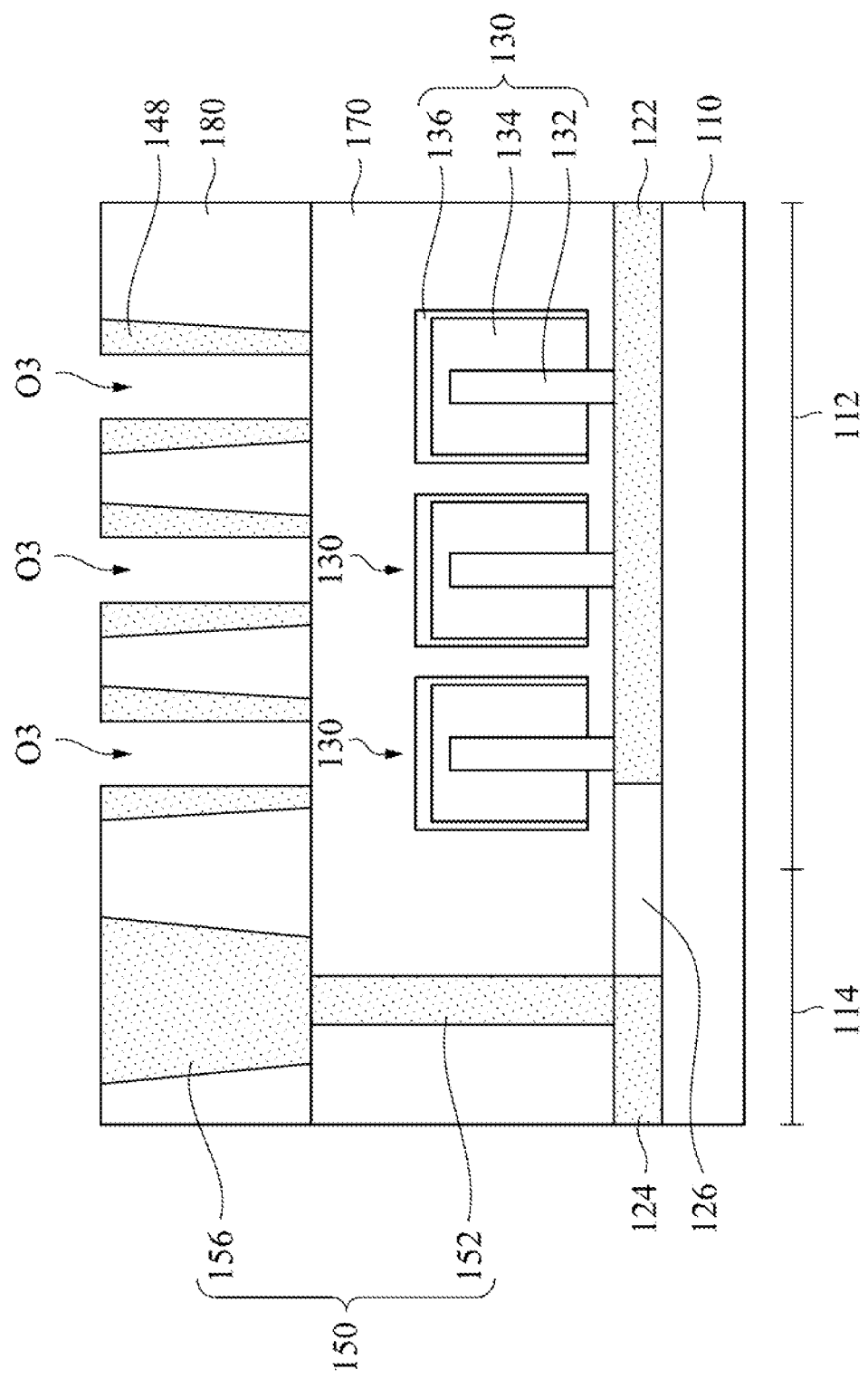

Referring to FIG. 5 to FIG. 7, after the middle portion 156 of the contact structure 150 and the gate materials 190 are formed, third openings O3 are respectively formed in the gate materials 190 to form the gate structure 148 respectively in the first openings O1. In other words, a portion of the gate material 190 is etched until the dielectric layer 170 is exposed. In some embodiments, the middle portion 156 of the contact structure 150 and the gate structure 148 include the same material, such as tungsten, or other suitable metals.

Figure 8:
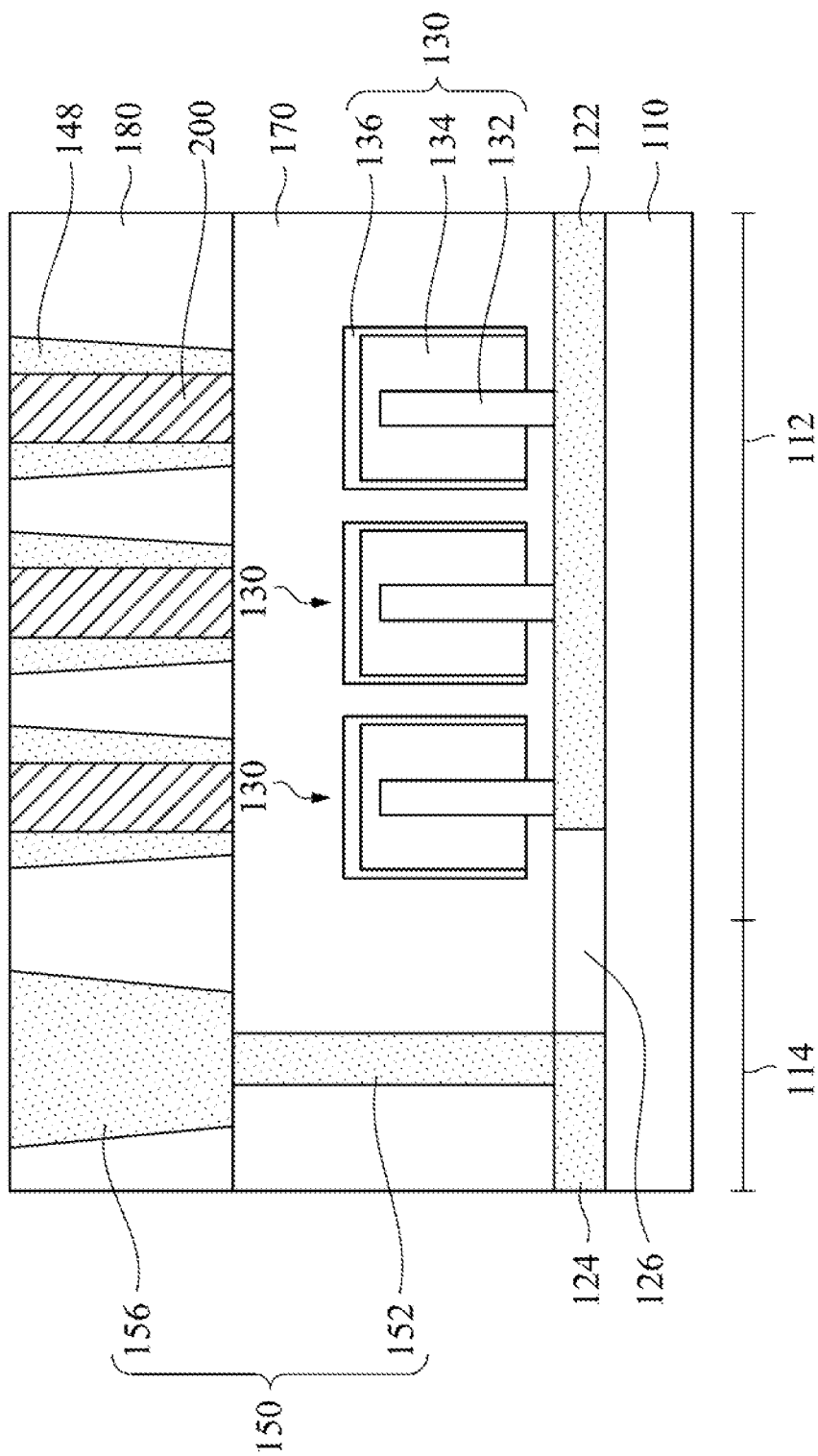

Referring to FIG. 7 and FIG. 8, dielectric materials 200 are filled in the third openings O3. In greater details, the dielectric materials 200 are formed above the dielectric material 200 and on a sidewall of the gate structure 148. In some embodiments, the dielectric material 200 is separated from the dielectric layer 180 by the gate structure 148.

In some embodiments, the dielectric material 200 includes a silicon oxide layer. Alternatively, the dielectric material 200 may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, or combinations thereof. The dielectric material 200 may be formed using chemical vapor deposition (CVD), physical vapor deposition (PVD), atomic layer deposition (ALD), thermal oxide, other suitable processes, or combinations thereof.

Figure 9:
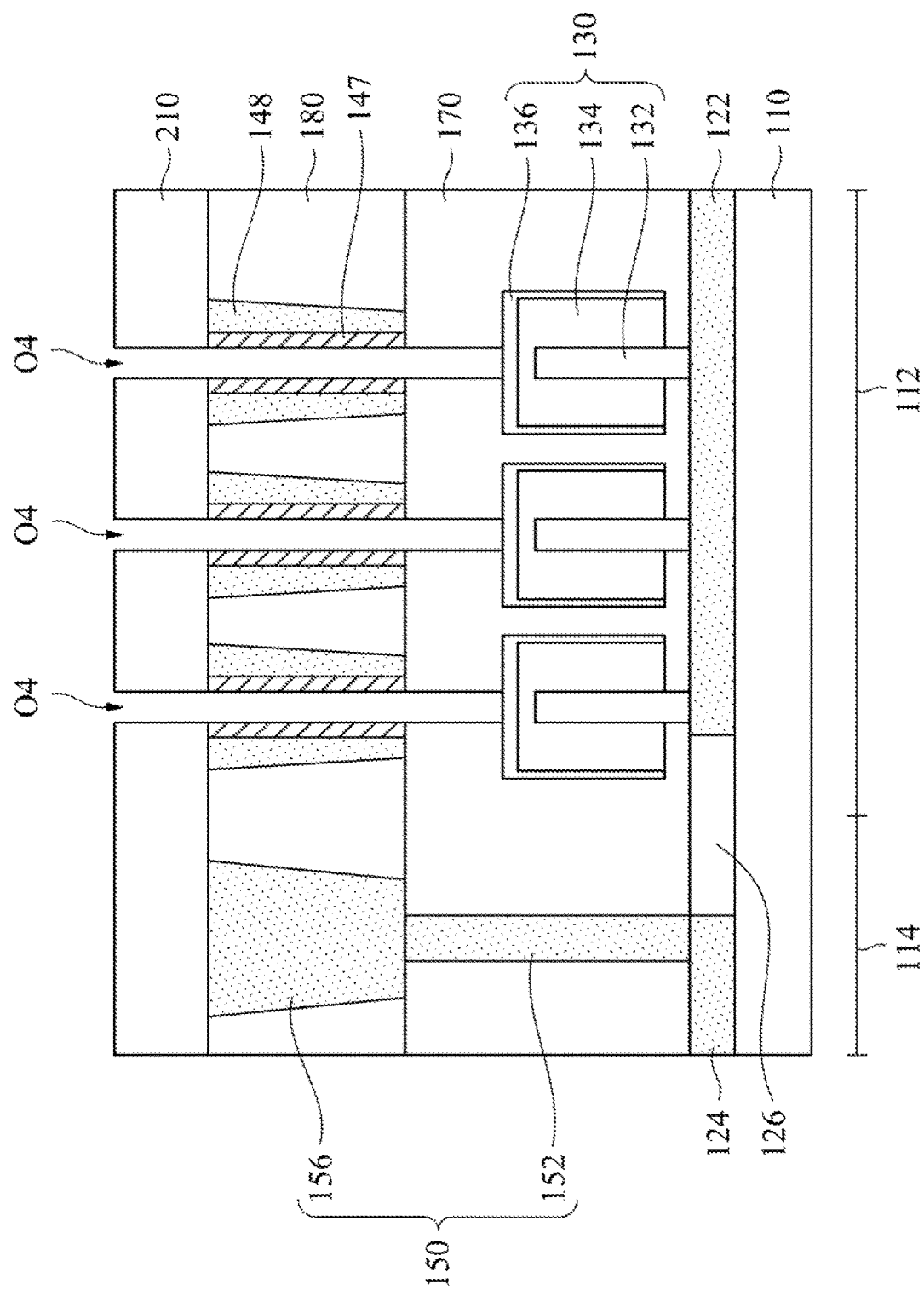

Referring to FIG. 8 and FIG. 9, after the dielectric material 200 is formed, a dielectric layer 210 is formed above the gate structure 148, the dielectric material 200, the dielectric layer 180, and the middle portion 156 of the contact structure 150. Thereafter, fourth openings O4 are formed in the dielectric layer 210, the dielectric material 200, and the dielectric layer 170 to form the gate dielectric layers 147, and the top electrodes 136 of the capacitor 130 are exposed. In other words, a sidewall of the gate dielectric layer 147 away from the gate structure 148 is exposed through the fourth opening O4.

In some embodiments, the dielectric layer 210 is formed by chemical vapor deposition (CVD), atomic layer deposition (ALD), or other suitable methods. The dielectric layer 210 may be made of silicon oxide ($SiO_2$), silicon nitride (SiN), silicon oxynitride (SiON), or other suitable materials.

Figure 10:
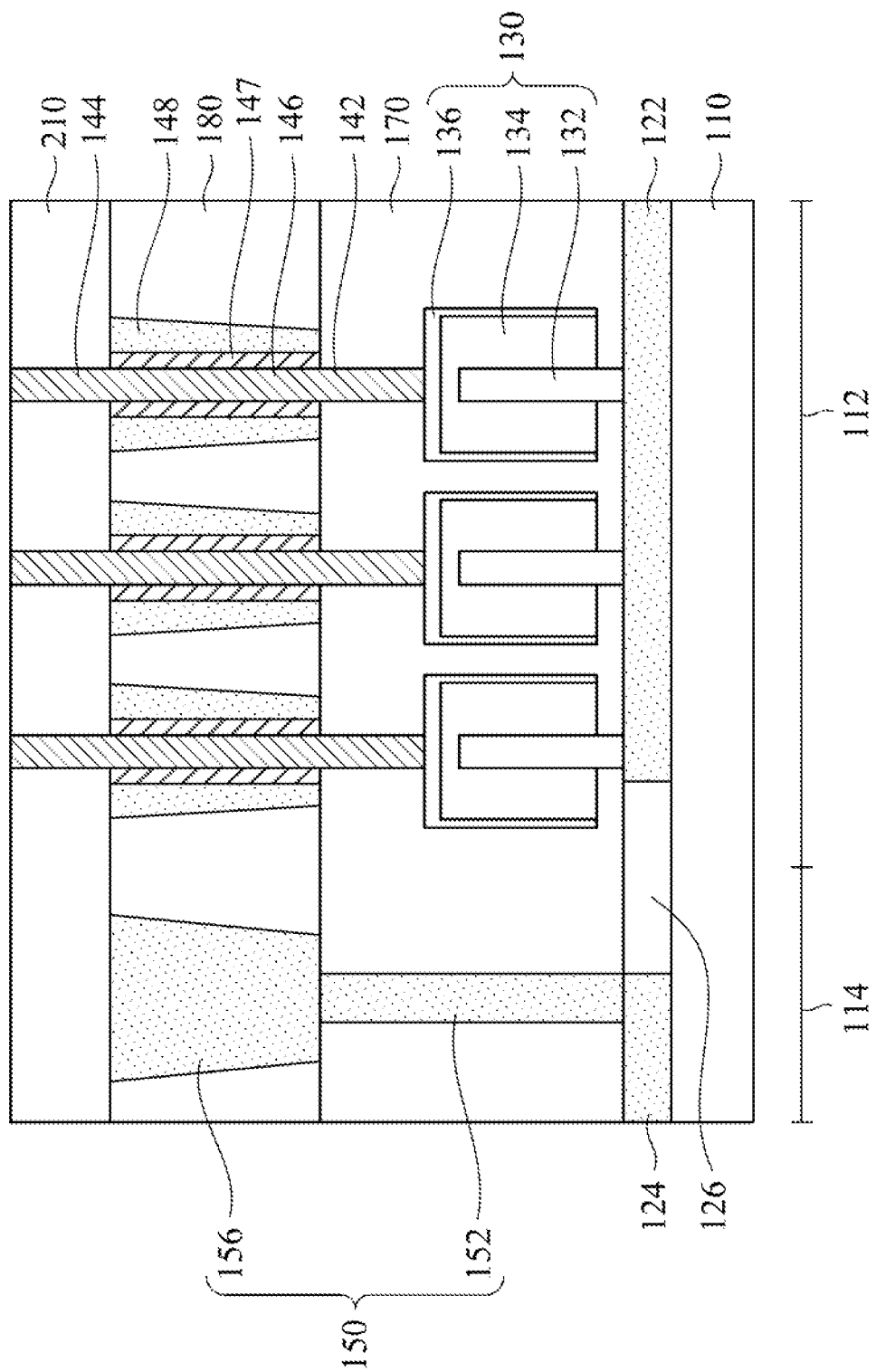

Referring to FIG. 9 and FIG. 10, after the fourth opening O4 is formed in the dielectric layer 210, the active areas are formed in the fourth openings O4. In greater details, each of the active areas includes the first source/drain region 142, the second source/drain region 144, and the channel 146. The first source/drain region 142 is formed in the dielectric layer 170, the channel 146 is formed on the sidewall of the gate dielectric layer 147, and the second source/drain region 144 is formed in the dielectric layer 210. In some embodiments, as shown in FIG. 7 to FIG. 10, the gate dielectric layer 147 and the channel 146 are formed in the third opening O3.

In some embodiments, after the active areas are formed in the fourth openings O4, a planarization process, e.g., a CMP process, is performed to remove excess portions outside the fourth openings O4.

In some embodiments, the first source/drain region 142, the second source/drain region 144, and the channel 146 include the same material. In some embodiments, the first source/drain region 142, the second source/drain region 144, and the channel 146 are an oxide layer which has a material different from that of the gate dielectric layer 147. For example, the first source/drain region 142, the second source/drain region 144, and the channel 146 may include silicon, oxide semiconductor, or other suitable materials.

Figure 11:
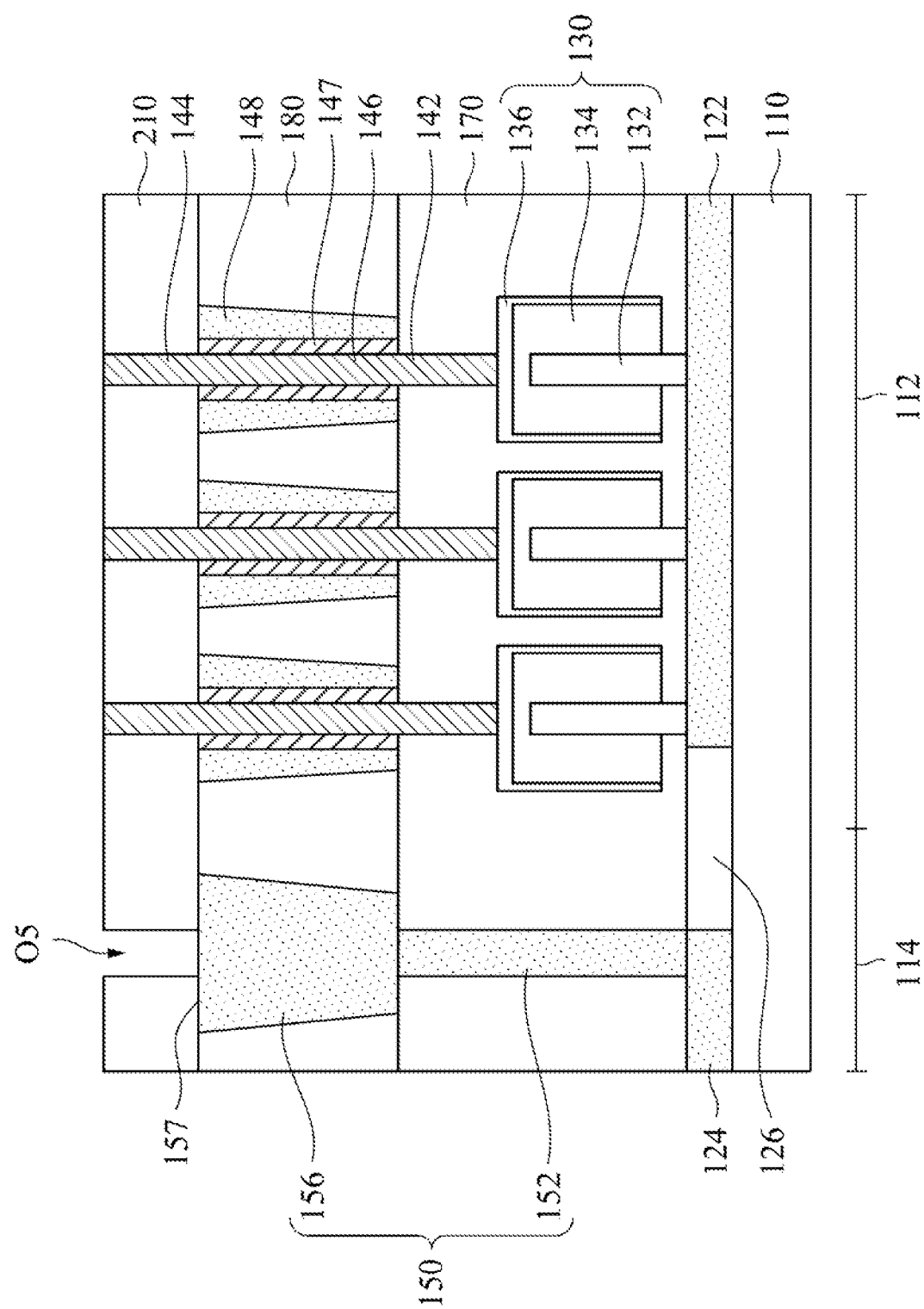

Referring to FIG. 11, after the active area (the first source/drain region 142, the second source/drain region 144, and the channel 146) is formed, a fifth opening O5 is formed in the dielectric layer 210, such that the middle portion 156 of the contact structure 150 is exposed. In some embodiments, a width of the fifth opening O5 is smaller than a width of the top surface 157 of the middle portion 156 of the contact structure 150. In other words, a portion of the top surface 157 of the middle portion 156 is exposed, while the other portions of the top surface 157 of the middle portion 156 are covered by the dielectric layer 210.

Figure 12:
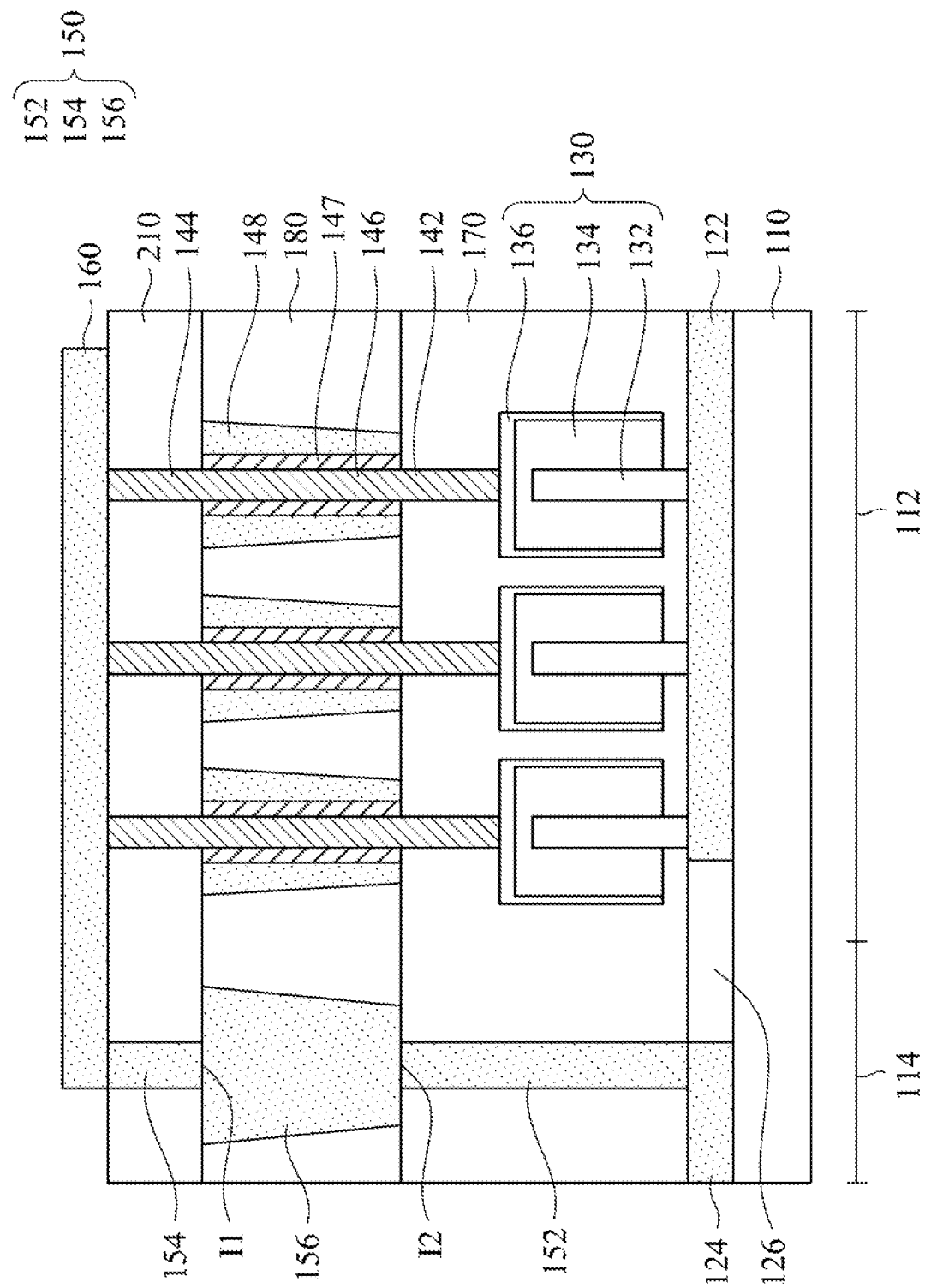

Referring to FIG. 11 and FIG. 12, after the fifth opening O5 is formed in the dielectric layer 210, the top portion 154 of the contact structure 150 is formed in the fifth opening O5 and the bit line 160 is formed above the dielectric layer 210. In some embodiments, the top portion 154 of the contact structure 150 and the bit line 160 are formed by forming a conductive material in the fifth opening O5 and above the dielectric layer 210 and patterning the conductive material into the bit line 160 by using suitable photolithography techniques.

In some embodiments, forming top portion 154 of the contact structure 150 and forming the bit line 160 are performed by using the same deposition process such that there is no interface between the top portion 154 of the contact structure 150 and the bit line 160. In some other embodiments, forming top portion 154 of the contact structure 150 and forming the bit line 160 are performed by using different deposition processes. For example, the top portion 154 of the contact structure 150 is formed in the dielectric layer 210, followed by another deposition process to form the bit line 160 above the dielectric layer 210 such that there is an interface between the top portion 154 of the contact structure 150 and the bit line 160 as shown in FIG. 12.

In some embodiments, the top portion 154 of the contact structure 150 and the bit line 160 include the same material, such as tungsten, aluminum, copper, or other conductive materials. In some embodiments, the top portion 154 and the bottom portion 152 of the contact structure 150 include the same material. Since the top portion 154 of the contact structure 150 and the middle portion 156 of the contact structure 150 are formed by using different deposition processes, the interface I1 is formed between the top portion 154 and the middle portion 156.

FIG. 13 is a cross-sectional view of a memory device 100a in accordance with another embodiment of the present disclosure. As shown in FIG. 13, the memory device 100a includes the substrate 110, the conductive line 124, the capacitors 130, the transistor 140, a contact structure 150a, and the bit line 160. The difference between the memory device 100a in FIG. 13 and the memory device 100 in FIG. 1 pertains to the profile of the contact structure 150a. Configurations of the substrate 110, the conductive line 124, the capacitor 130, the transistor 140, and the bit line 160 are similar to the embodiment shown in FIG. 1, and the description is not repeated hereinafter.

In FIG. 13, the contact structure 150a includes a bottom portion 152a, a top portion 154a, and a middle portion 156a. The bottom portion 152a is connected to the conductive line 124. The top portion 154a is connected to the second source/drain regions 144 of the transistors 140. The middle portion 156a is wider than the top portion 154a and the bottom portion 152a, in which the middle portion 156a of the contact structure 150a is at a height substantially level with the gate structure 148 of the transistor 140. The top portion 154a of the contact structure 150a and the bottom portion 152a of the contact structure 150a are misaligned with each other in a vertical direction D. In some embodiments, an angle θ between a sidewall 153a of the middle portion 156a and a bottom surface 155a of the middle portion 156a is larger than about 90 degrees and smaller than about 180 degrees. For example, the angle θ between the sidewall 153a of the middle portion 156a and the bottom surface 155a of the middle portion 156a ranges from about 135 degrees to about 180 degrees. Other relevant structural and manufacturing details of the memory device 100a of FIG. 13 are all substantially the same as or similar to the memory device 100 of FIG. 1, and, therefore, a description in this regard will not be repeated hereinafter.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a memory device, comprising:
   forming a first conductive line above a memory region of a substrate and a second conductive line above a peripheral region of the substrate;
   forming a capacitor above the first conductive line;
   forming a bottom portion of a contact structure above the second conductive line;
   forming a first dielectric layer covering the capacitor and the bottom portion of the contact structure;
   etching the first dielectric layer to form a first opening and a second opening in the first dielectric layer, wherein the first opening is above the capacitor, and the second opening exposes the bottom portion of the contact structure;
   filling a conductive material in the first opening and the second opening such that a middle portion of the contact structure is formed in the second opening and a gate material is formed in the first opening;
   forming a third opening in the gate material to form a gate structure in the first opening;
   forming a gate dielectric layer and a channel in the third opening; and
   forming a bit line to be connected to the channel and the contact structure.

2. The method of claim 1, wherein forming the first opening and the second opening are performed by using one etching process.

3. The method of claim 1, further comprising:
   forming a second dielectric layer above the gate structure prior to forming the bit line.

4. The method of claim 3, further comprising:
   forming a top portion of the contact structure in the second dielectric layer.

5. The method of claim 3, further comprising:
   forming a source/drain region in the second dielectric layer, and the bit line is formed to be connected to the source/drain region.

6. The method of claim 1, wherein the middle portion of the contact structure and the gate structure comprise the same material.

7. The method of claim 1, wherein the channel is an oxide layer.

* * * * *